(12) United States Patent
Hsu et al.

(10) Patent No.: US 11,988,239 B2
(45) Date of Patent: May 21, 2024

(54) SCREW NUT AND ELECTRONIC DEVICE HAVING THE SAME

(71) Applicant: WISTRON CORP., New Taipei (TW)

(72) Inventors: Hsin-Chuan Hsu, New Taipei (TW); Ming Chun Wang, New Taipei (TW)

(73) Assignee: WISTRON CORP., New Taipei (TW)

( * ) Notice: Subject to any disclaimer, the term of this patent is extended or adjusted under 35 U.S.C. 154(b) by 746 days.

(21) Appl. No.: 17/121,798

(22) Filed: Dec. 15, 2020

(65) Prior Publication Data

US 2022/0128083 A1 Apr. 28, 2022

(30) Foreign Application Priority Data

Oct. 28, 2020 (TW) ................. 109137348

(51) Int. Cl.
| | | |
|---|---|---|
| *F16B 37/04* | (2006.01) | |
| *F16B 5/02* | (2006.01) | |
| *F16B 37/12* | (2006.01) | |
| *G06F 1/16* | (2006.01) | |

(52) U.S. Cl.
CPC ............... *F16B 37/04* (2013.01); *F16B 5/02* (2013.01); *F16B 5/0266* (2013.01); *F16B 37/12* (2013.01); *G06F 1/16* (2013.01)

(58) Field of Classification Search
CPC .......... F16B 37/04; F16B 5/02; F16B 5/0266; F16B 37/12; F16B 5/0241; F16B 37/048; F16B 35/00; F16B 37/061; F16B 43/00; F16B 5/025; F16B 37/044; F16B 37/122;
(Continued)

(56) References Cited

U.S. PATENT DOCUMENTS

| | | | | |
|---|---|---|---|---|
| 4,929,136 A | * | 5/1990 | Mee ...................... | F16B 35/047 |
| | | | | 411/432 |
| 2005/0146343 A1 | * | 7/2005 | Wright ............... | G01R 31/2891 |
| | | | | 324/750.05 |

(Continued)

FOREIGN PATENT DOCUMENTS

| | | | | |
|---|---|---|---|---|
| CN | 2448986 Y | | 9/2001 | |
| DE | 102019105237 A1 | * | 9/2020 | ............. F01N 13/00 |

(Continued)

OTHER PUBLICATIONS

CN Office Action dated Jul. 26, 2023 in Chinese application No. 202011340706.4.

(Continued)

*Primary Examiner* — Kristina R Fulton
*Assistant Examiner* — Jock Wong
(74) *Attorney, Agent, or Firm* — McClure, Qualey & Rodack, LLP

(57) ABSTRACT

An electronic device has a screw nut. The screw nut is configured for fixation of a fastener. The screw nut includes an inner nut component, a cushioning component, and an outer nut component. The inner nut component has a screw hole portion configured for fixation of the fastener. The cushioning component is sleeved on the inner nut component. The outer nut component is sleeved on the cushioning component. The cushioning component is connected between the inner nut component and the outer nut component so that the inner nut component is movably connected to the outer nut component.

7 Claims, 6 Drawing Sheets

(58) Field of Classification Search
CPC .......... F16F 15/06; G06F 1/16; H05K 5/0217; H05K 5/0008
USPC ......... 411/432, 113, 111, 112; 267/156, 164, 267/165, 168, 180
See application file for complete search history.

(56) References Cited

U.S. PATENT DOCUMENTS

| | | | |
|---|---|---|---|
| 2014/0248078 A1* | 9/2014 | Lin | F28D 15/0275 403/291 |
| 2015/0240860 A1* | 8/2015 | Wang | F16B 5/0266 411/147 |
| 2018/0266461 A1* | 9/2018 | Cheynet De Beaupre | F16B 5/01 |

FOREIGN PATENT DOCUMENTS

| | | | | |
|---|---|---|---|---|
| JP | 2012149698 A | | 8/2012 | |
| JP | 6177985 B1 | * | 8/2017 | |
| KR | 20180003623 A | * | 1/2018 | |
| TW | 439893 U | | 6/2001 | |
| WO | WO-2020157794 A1 | * | 8/2020 | ........... F01N 13/102 |

OTHER PUBLICATIONS

CN Office Action dated Apr. 14, 2023 in Chinese application No. 202011340706.4.
TW Office Action dated Apr. 8, 2021 in Taiwan application (No. 109137348).

* cited by examiner

SCREW NUT AND ELECTRONIC DEVICE HAVING THE SAME

CROSS-REFERENCE TO RELATED APPLICATIONS

This non-provisional application claims priority under 35 U.S.C. § 119(a) on Patent Application No(s). 109137348 filed in Taiwan (R.O.C.) on Oct. 28, 2020, the entire contents of which are hereby incorporated by reference.

TECHNICAL FIELD

The disclosure relates to a fixation device, more particularly to a screw nut and an electronic device including the same.

BACKGROUND

For the sensing devices that are required to meet the demand of high precision and accuracy, their designs may involve additional requirements other than the basic sensing functions, such as achieving lightweight and thin size while being cost-effective and able to dissipate heat. Considering these requirements, the device casing may be configured for facilitating heat dissipation.

Take the existing image sensing devices having depth camera as an example, this type of sensing devices generally has a compact internal space due to the lightweight and small size designs, thus the heat dissipation may rely on their back plate. To achieve this, the depth camera is arranged to thermally contact the back plate so as to dissipate its heat outside through the back plate. However, this approach may lead to other issues.

In detail, the typical back plate is unable to cushion impact force, thus when the device hits the ground, the depth camera will cause a large pushing force to the back plate, and this impact easily causes the fixation parts of the back plate to deform. As a result, the depth camera is permanently out of its original position due to the deformation of the back plate, resulting in an unknown amount of position deviation. This not only causes inaccurate positioning but also leads to a troublesome and time-consuming calibration process for unknown deviation.

SUMMARY

Accordingly, the present disclosure provides a screw nut and an electronic device having the same that are capable of effectively cushioning impact force.

One embodiment of the disclosure provides a screw nut configured for fixation of a fastener. The screw nut includes an inner nut component, a cushioning component, and an outer nut component. The inner nut component has a screw hole portion configured for fixation of the fastener. The cushioning component is sleeved on the inner nut component. The outer nut component is sleeved on the cushioning component. The cushioning component is connected between the inner nut component and the outer nut component so that the inner nut component is movably connected to the outer nut component.

Another embodiment of the disclosure provides an electronic device configured to be assembled using at least one fastener. The electronic device includes a housing part, a plate part, and at least one screw nut. The plate part has at least one through hole configured for insertion of the at least one fastener. The at least one screw nut is configured for fixation of the at least one fastener. The at least one screw nut includes an inner nut component, a cushioning component, and an outer nut component. The inner nut component has a screw hole portion configured for fixation of the at least one fastener. The cushioning component is sleeved on the inner nut component. The outer nut component is sleeved on the cushioning component. The cushioning component is connected between the inner nut component and the outer nut component so that the inner nut component is movably connected to the outer nut component. The outer nut component is fixed to the housing part, and the plate part is to the housing part via the at least one fastener being screwed into the screw hole portion of the inner nut component.

According to the screw nut and the electronic device having the same as discussed in the above embodiments of the disclosure, since the inner nut component and the outer nut component that are used for the fixation of fastener has a cushioning component therebetween, the inner nut component can be movably connected to the outer nut component in multi-directional directions via the cushioning component, thus in the application that the screw nut is used to fix a plate part to a housing part of an electronic device, the screw nut can allow the plate part to have a small and multi-directional range of motion with respect to the housing part, thereby effectively cushioning the impact force on the plate part so as to prevent the fixation portions of the plate part from deforming due to the impact force.

For example, in the case that the aforementioned electronic device is an image sensing device, the impact force that the image capturing unit applies on the plate part will be suppressed/absorbed by the cushioning component, thereby preventing the impact force from permanently deforming the plate part. As a result, the image capturing unit is prevented from permanently out of its original position due to the deformation of the plate part, thus the inaccurate positioning of the image capturing unit and the calibration due to position deviation are prevented.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
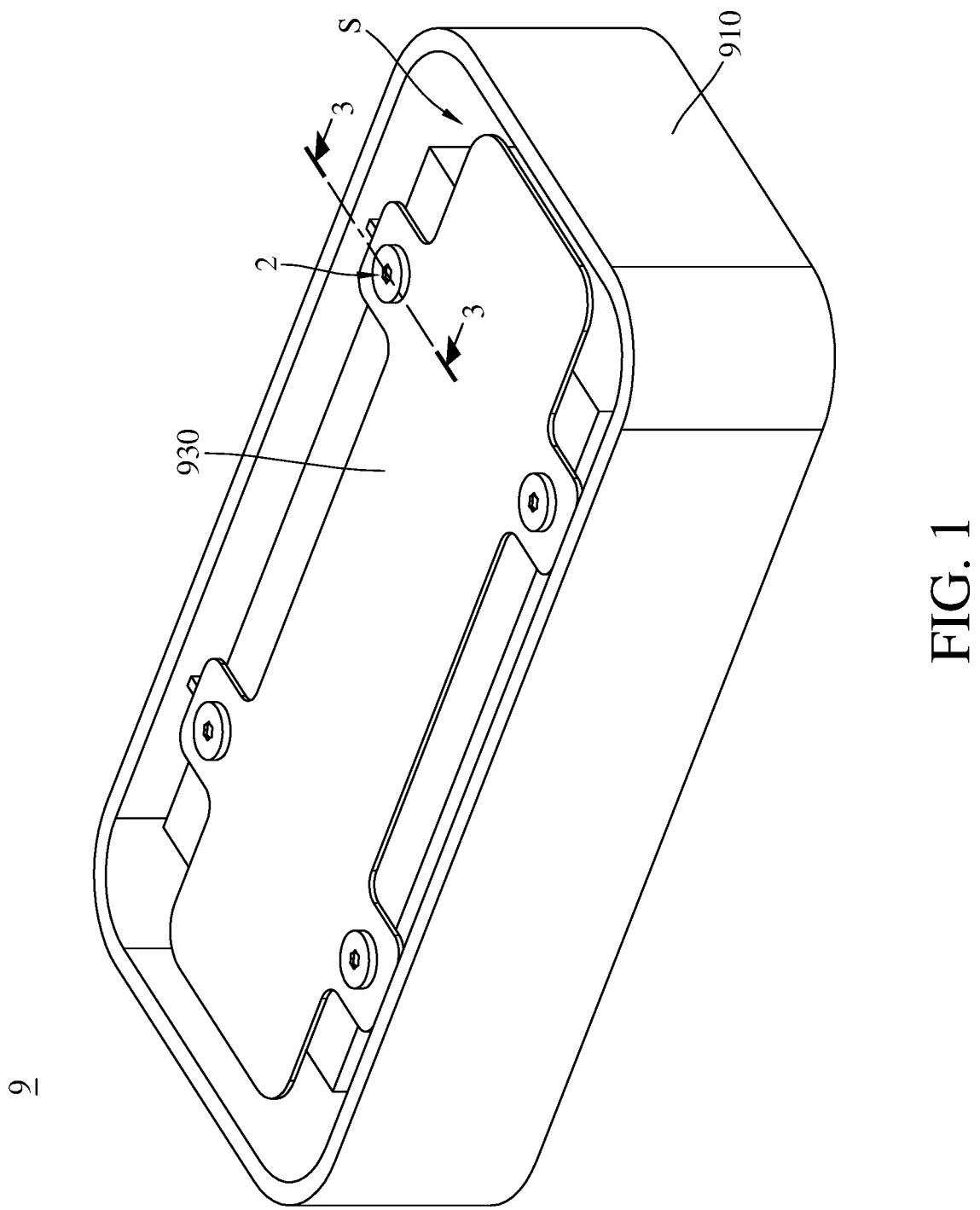
FIG. 1 is a perspective view of an electronic device according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details.

The following embodiments will be described with reference to the drawings. For the purpose of clear illustration, some conventional elements and components may be illustrated in a simple and clear manner. Some of the features in the drawings may be slightly exaggerated or illustrated in a larger proportion for the ease of viewing but are not intended to limit the disclosure. In addition, for the same reason, some of the elements or components in the drawings may be illustrated in dotted lines.

Herein, the terms, such as "end", "part", "portion", "area", may be used to refer to specific features of or between elements or components but are not intended to limit the elements and components. In addition, the terms, such as "substantially" and "approximately", as used herein may mean a reasonable amount of deviation of the described term such that the end result is not significantly changed.

Further, unless explicitly stated, the term "at least one" as used herein may mean that the quantity of the described element or component is one or larger than one but does not necessarily mean that the quantity is only one. The term "and/or" may be used herein to indicate that either or both of two stated possibilities.

Figure 2:
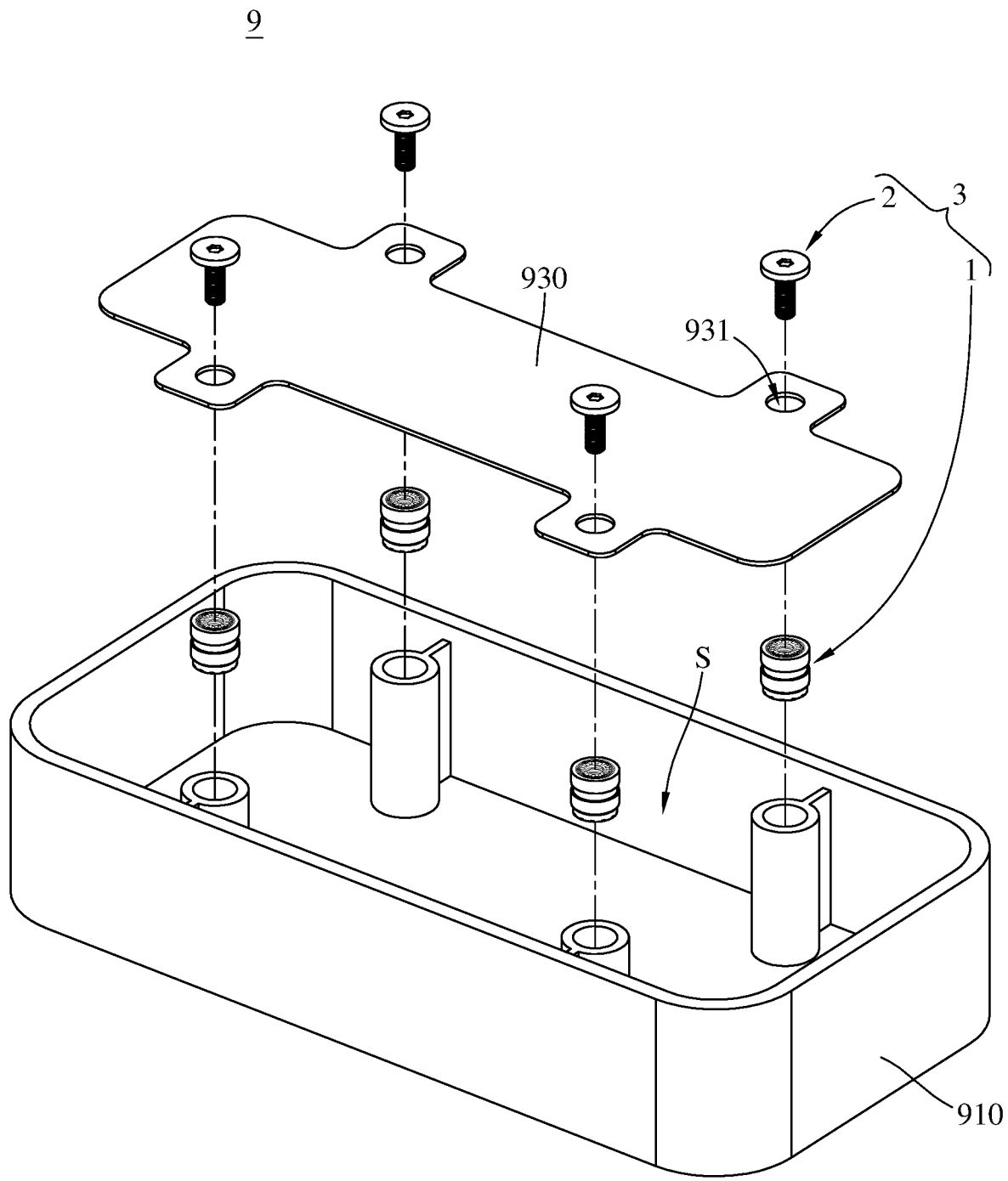
FIG. 2 is an exploded view of the electronic device in FIG. 1.

Firstly, referring to FIGS. 1-2, one embodiment of the disclosure provides an electronic device 9, where FIG. 1 illustrates a perspective view of an electronic device 9 and FIG. 2 illustrates an exploded view of the electronic device 9. For the purpose of simple illustration, the drawings may simplify or omit some electrical/nonelectrical components irrelevant to the spirit of the disclosure, such as cables and components accommodated in the electronic device 9.

In this embodiment, the electronic device 9 is, but not limited to, an image sensing device that is capable of capturing capture depth-of-field information. The electronic device 9 can be hung on wall or held in hands depends on the requirements and scenarios. The electronic device 9 shown in FIG. 1 is exemplary for the spirit of the disclosure but not intended to limit the disclosure in any aspect. For example, the electronic devices in other embodiments may be an interactive electronic device or handheld electronic device in other forms.

As shown, the electronic device 9 may at least include a housing part 910, a plate part 930, and at least one screw nut 1. The housing part 910 is the part of the electronic device 9 that can accommodate and support the components required for achieving the functions of the electronic device 9. The housing part 910 is opened at one end, serving as a passage allowing the placement of the components into an accommodation space S of the housing part 910 or the removal of the components from the accommodation space S. In the application that the electronic device 9 is an image sensing device, the components being accommodated in the housing part 910 may include an image capturing unit (e.g., a depth camera, not-numbered but illustrated as a schematic block located under the plate part 930 as shown in FIG. 1) configured for capturing depth-of-field information.

Each of the screw nuts 1 is fixed on the housing part 910 and can be cooperated with a fastener 2. As shown, the fastener 2 can be screwed into the screw nuts 1 to form a fixation component 3 with the screw units 1. The plate part 930 can be assembled to the housing part 910 by screwing the fastener 2 into the screw nut 1. In some applications, the plate part 930 can not only be used as a barrier or a cover to close the opening end of the housing part 910 but also can be used as a heat dissipation plate that can thermally contact the internal components (e.g., the aforementioned image capturing unit) to dissipate the heat outside; in this case, the plate part 930 may also be called as a heat dissipation plate.

For example, in the application that the electronic device 9 is an image sensing device, it is required for removing heat generated by the image capturing unit accommodated in the housing part 910, thus the plate part 930 is not only a back plate but also is a heat dissipation plate being in thermal contact with the image capturing unit to dissipate the heat generated by the image capturing unit outside. In this arrangement, the plate part 930 is indirect contact with the image capturing unit, thus any external force or impact force applied on the electronic device 9 will be transmitted to the plate part 930 through the image capturing unit, leading to a pushing force on the plate part 930. For instance, if the electronic device 9 is dropped so that it hits the ground, the impact force will be transmitted to the plate part 930 through the image capturing unit.

Figure 3:
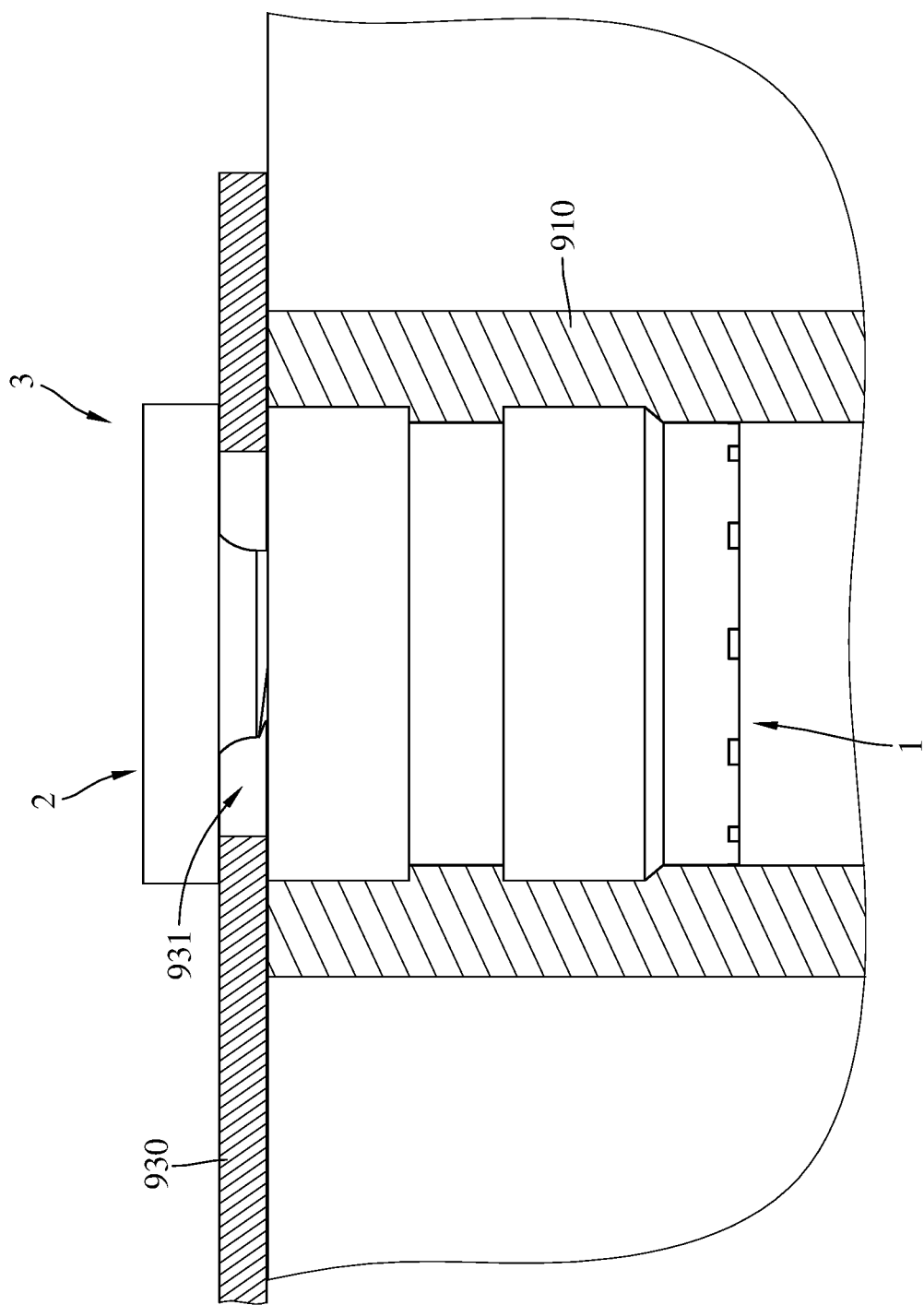
FIG. 3 is a partial enlarged view of the electronic device taken along line 3-3 of FIG. 1.
Figure 4:
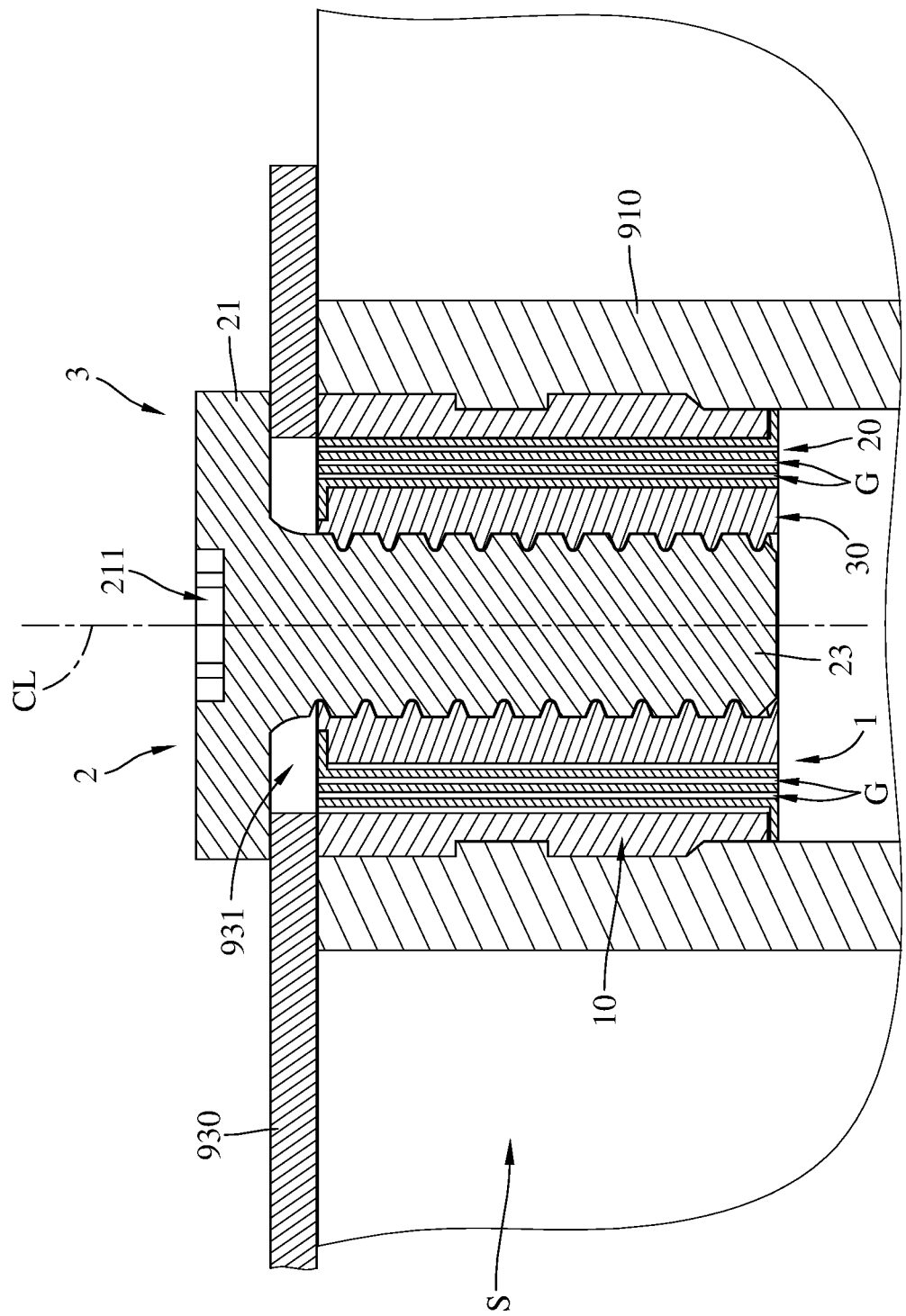
FIG. 4 is a cross-sectional view of the electronic device in FIG. 3.
Figure 5:
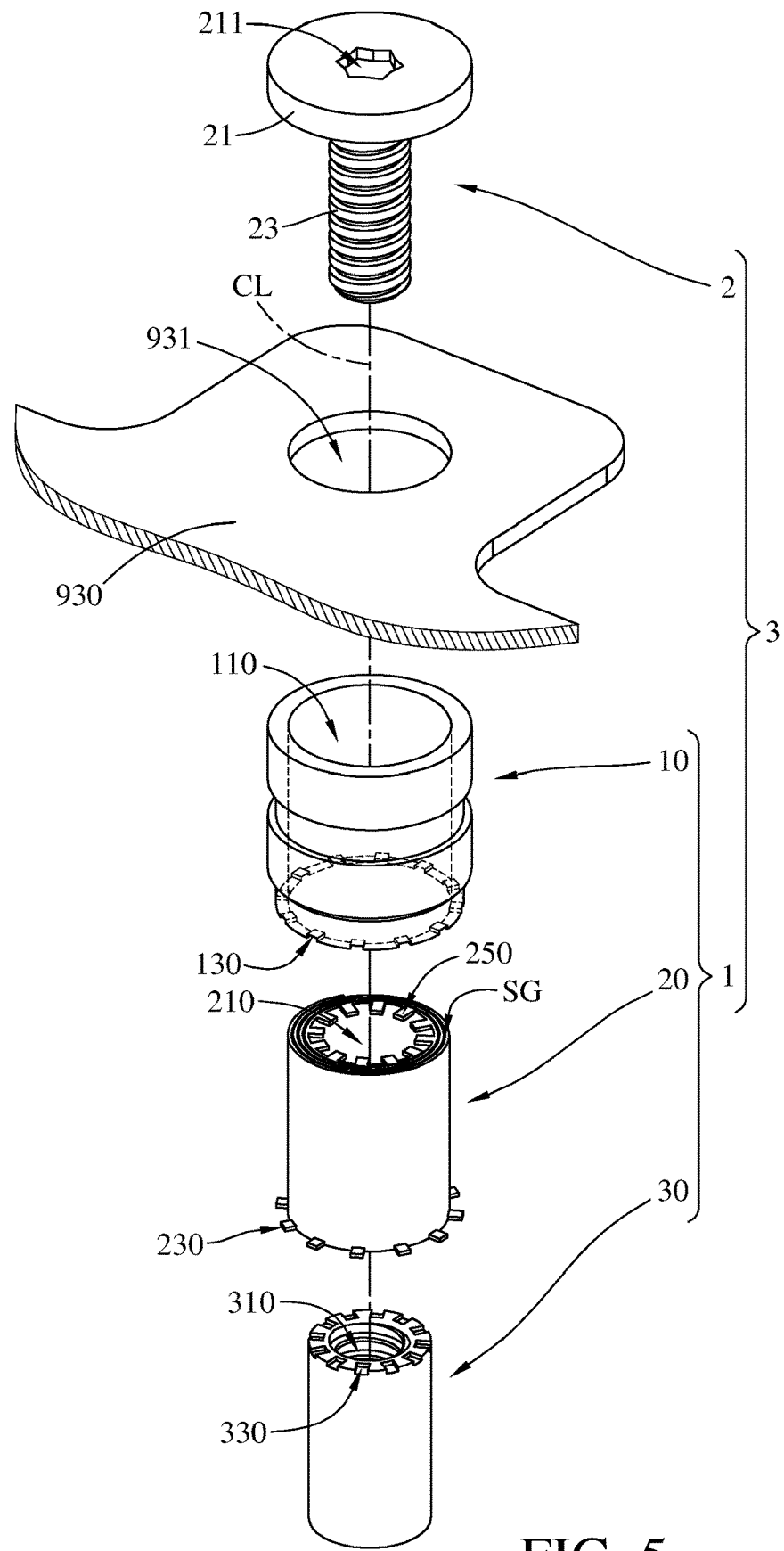
FIG. 5 is an exploded view of a fixation component in FIG. 1.

To avoid the impact force from deforming the plate part 930 to change the predetermined position of the component connected thereto (e.g., the aforementioned image capturing unit), the screw nut 1 is specifically designed. In detail, please further refer to FIGS. 3-5, where FIG. 3 is a partial enlarged view of the electronic device 9, FIG. 4 is a cross-sectional view of the electronic device 9, and FIG. 5 is an exploded view of the fixation component 3.

As shown, in this embodiment, the screw nut 1 may each include an outer nut component 10, a cushioning component 20, and an inner nut component 30. In corresponding to the number and arrangement of the screw nuts 1, the plate part 930 may have at least one through hole 931. In each screw nut 1, the outer nut component 10 is fixed to the housing part 910 and sleeved on the cushioning component 20, and the cushioning component 20 is sleeved on the inner nut component 30, such that the inner nut component 30 is connected to the outer nut component 10 via the cushioning component 20. The fastener 2 can be disposed through the through hole 931 of the plate part 930 and then screwed into the inner nut component 30, by doing so, the fastener 2 is fixed to the housing part 910 sequentially via the inner nut component 30, the cushioning component 20, and the outer nut component 10, such that the plate part 930 can be fixed to the housing part 910. Also, the cushioning component 20 allows the inner nut component 30 and the fastener 2 fixed to the inner nut component 30 to change their position relative to the outer nut component 10. The details are given below.

In this embodiment, the fastener 2 is, for example, a screw. The fastener 2 may include a head portion 21 and a thread portion 23 connected to each other. The head portion 21 may have a drive (also called "screw drive" or "socket") 211. The drive 211 is a shaped recess or cavity formed on the top surface of the head portion 21 that allows the fastener 2 to be turned by a simple tool (e.g., screwdriver or electric drill). The drive 211 is, for example, a hex drive, a Phillips drive, a slot drive, or other regular types of screw drive. The thread portion 23 has an outer diameter smaller than that of the head portion 21. The thread portion 23 has its outer surface threaded so as to be mate with a screw hole portion 310 of the inner nut component 30. Note that the size and configuration of the fastener 2 and the drive 211 thereon are exemplary and not intended to limit the disclosure.

The outer nut component 10 is the part of the screw nut 1 that directly connects the housing part 910. The outer nut component 10 is hollow and cylindrical shaped. The outer nut component 10 is made of, for example, metal. The outer nut component 10 can be inserted into or embedded in positioning holes (not numbered) of the housing part 910 and fixed to the housing part 910 via any suitable manner, such as melting of contact areas, welding, or adhesive.

Alternatively, in some other embodiments, the outer nut component may be integrally formed with the housing part and therefore can be considered as a part of the housing part. In addition, the outer nut component 10 may have a first through hole portion 110 for the insertion of the inner nut component 30 and the cushioning component 20.

The cushioning component 20 is hollow and cylindrical shaped. The cushioning component 20 is, but not limited to, a spiral flat wire made of a flat and durable elastic metal. Thus, the cushioning component 20 has similar functions to a volute spring and therefore is capable of producing a large load and absorbing energy relative to the space and volume it occupies, making it a suitable spring for absorbing shock. In addition, the cushioning component 20 has a second through hole portion 210 at its center, enabling the insertion of the inner nut component 30. As shown, the outermost layer of the cushioning component 20 can be fixed to the inner surface of the outer nut component 10 via any suitable manner, such as melting of contact areas, welding, or adhesive, and the innermost layer of the cushioning component 20 can be fixed to the outer surface of the inner nut component 30 via any suitable manner, such as melting of contact areas, welding, or adhesive. That is, the cushioning component 20 is located between and clamped by the inner surface of the outer nut component 10 and the outer surface of the inner nut component 30. When there is no external force on the screw nut 1, the cushioning component 20 wounds around the inner nut component 30 about a central line CL of the inner nut component 30.

In more detail, as shown in FIGS. 4-5, the solid portions of the cushioning component 20 forms a spiral-shaped gap SG between the outer nut component 10 and the inner nut component 30, such that the adjacent solid portions of the cushioning component 20 in each radial direction are spaced apart from one another by a plurality of changeable gaps G. The changeable gaps G are substantially parallel to one another and arranged along a direction perpendicular to the central line CL of the inner nut component 30 and located between the outer nut component 10 and the inner nut component 30.

In such an arrangement, the cushioning component 20 is elastically deformable in the direction along the central line CL of the inner nut component 30 and/or in the direction perpendicular to the central line CL. Thus, with the cushioning component 20, the inner nut component 30 is movable with respect to the outer nut component 10 in the direction along the central line CL of the inner nut component 30 and/or in the direction perpendicular to the central line CL, such that the position of the central line CL relative to the outer nut component 10 is changeable. In other words, the cushioning component 20 allows multi-directional movements of the inner nut component 30 with respect to the outer nut component 10. Thus, due to the cushioning component 20, the inner nut component 30, the fastener 2 fixed to the inner nut component 30, and the plate part 930 fixed to the fastener 2 are allowed to have multi-directional movements with respect to the outer nut component 10 when the cushioning component 20 is deformed.

In addition, to improve the connection between the outer nut component 10 and the cushioning component 20, in this embodiment, the outer nut component 10 may have a plurality of teeth 130, and the cushioning component 20 may have a plurality of teeth 230. The teeth 130 are arranged along one edge of the outer nut component 10 and spaced apart from one another, and the teeth 230 radially protrude outward from one edge of the outermost layer of the cushioning component 20 and spaced apart from one another. The teeth 130 are configured to mate with the teeth 230. As shown, when the outer nut component 10 is sleeved on the cushioning component 20, the teeth 130 are meshed with the teeth 230 so as to increase the areas for the outer nut component 10 and the cushioning component 20 for being melted, welding, or adding adhesive, reinforcing the connection between the outer nut component 10 and the cushioning component 20. Note that the positions of the teeth 130 and the teeth 230 are exemplary and not intended to limit the disclosure; in some other embodiments, the teeth 130 and the teeth 230 can be switched places, in this case, the teeth 130 are arranged along the edge of the cushioning component 20, and the teeth 230 are arranged to be radially protruding inward from one edge of the outer nut component 10, and this arrangement also can enable the meshing between the teeth 130 and the teeth 230 when the outer nut component 10 is sleeved on the cushioning component 20.

Similarly, to improve the connection between the cushioning component 20 and the inner nut component 30, in this embodiment, the cushioning component 20 may have a plurality of teeth 250, and the inner nut component 30 may have a plurality of teeth 330. The teeth 250 radially protrude inwardly from one edge of the innermost layer of the cushioning component 20 and spaced apart from one another, and the teeth 330 are arranged along one edge of the inner nut component 30 and spaced apart from one another. The teeth 250 are configured to mate with the teeth 330. As shown, when the cushioning component 20 is sleeved on the inner nut component 30, the teeth 250 are meshed with the teeth 330, so as to increase the areas for the cushioning component 20 and the inner nut component 30 for being melted, welding, or adding adhesive, reinforcing the connection between the cushioning component 20 and the inner nut component 30. Note that the positions of the teeth 250 and the teeth 330 are exemplary and not intended to limit the disclosure; in some other embodiments, the teeth 250 and the teeth 330 can be switched places, in this case, the teeth 250 are arranged to be radially protruding outwardly from one edge of the inner nut component 30, and the teeth 330 are arranged along one edge of the cushioning component 20, and this arrangement also can enable the meshing between the teeth 250 and the teeth 330 when the cushioning component 20 is sleeved on the inner nut component 30.

Figure 6:
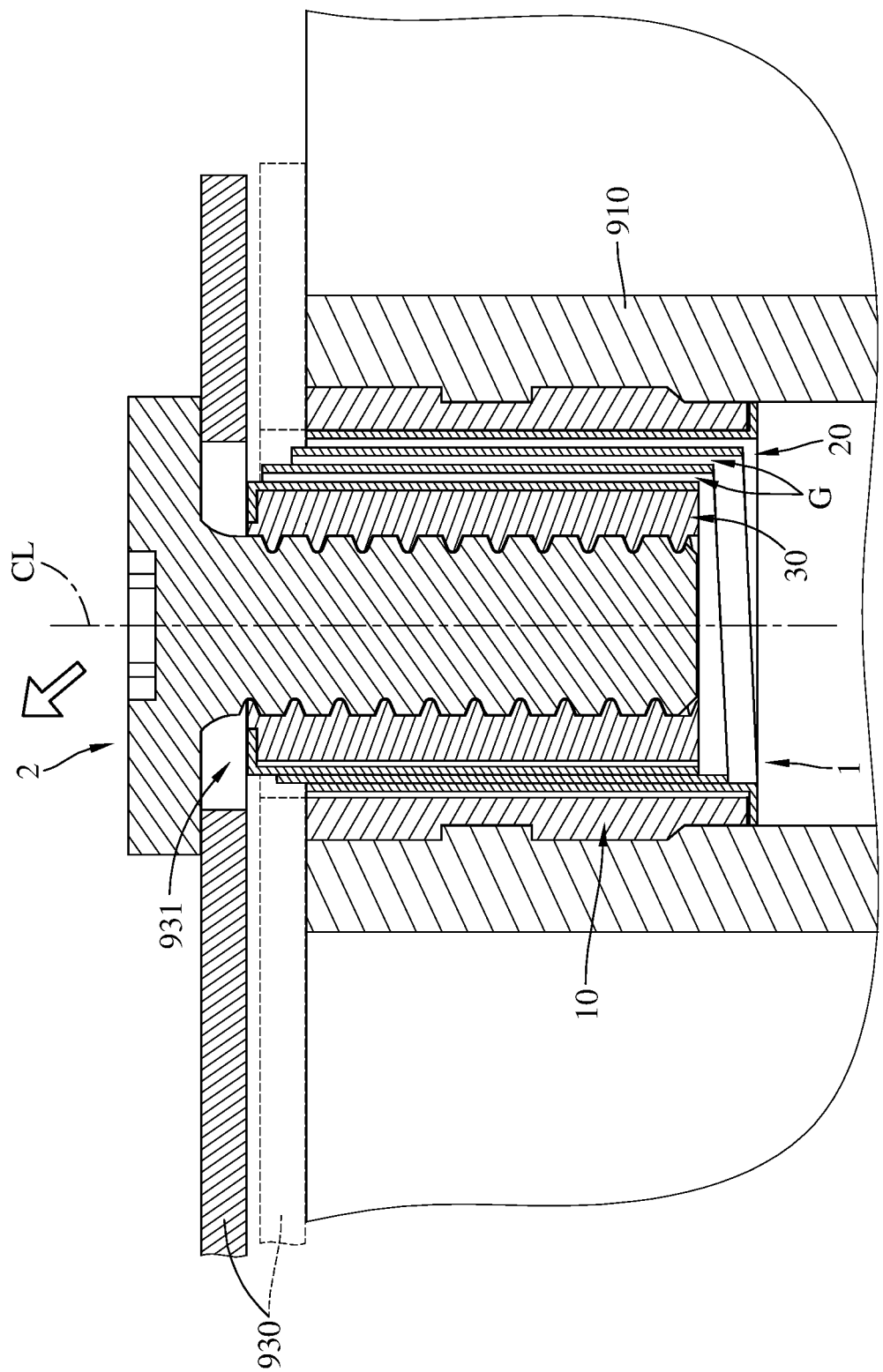
FIG. 6 illustrates the electronic device in FIG. 4 when in response to external impact.

Then, please refer to FIGS. 1 and 4 and further refer to FIG. 6 to explain how the electronic device 9 responds to external impact. In detail, FIG. 6 illustrates that the electronic device 9 is dropped and hitting the ground, at this moment, the impact force is transmitted to the internal components (e.g., the image capturing unit shown in FIG. 1) and then to the plate part 930, and the plate part 930 can cause the screw nut 1 to change from FIG. 4 to FIG. 6 by moving the fastener 2. The impact force may be transmitted in multiple directions. Take the arrow shown in FIG. 6 as an example of the direction of the impact force, the plate part 930 may force the fastener 2 to move in the direction indicated by the arrow, the cushioning component 20 being connected between the inner nut component 30 and the outer nut component 10 can be very responsive to the motion of the fastener 2, thus the pulling of the fastener 2 can cause the cushioning component 20 to deform so as to suppress and absorb the impact force that the internal components applies onto the plate part 930.

In specific, as discussed above, the spiral flat wire cushioning component 20 is elastically deformable in the direction along the central line CL of the inner nut component 30 and in the direction perpendicular to the central line CL, that is, the cushioning component 20 is substantially deformable in all directions so as to effectively respond to any motion of the fastener 2. The impact force is transmitted to the outer nut component 10 through the housing part 910 and is transmitted to the cushioning component 20 through the plate part 930 and the fastener 2, as the arrow is shown in FIG. 6, the plate part 930 and the fastener 2 may be pulled towards, for example, the top left corner of the drawing. In response to this, the changeable gaps G at the left side become smaller, and the changeable gaps G at the right side become bigger, and the cushioning component 20 is deformed to become a conical shape with a tip leaning towards the top left corner. The deformation of the cushioning component 20 permits the motion of the plate part 930 in a direction away from the screw nut 1. During the movement, the elasticity of the cushioning component 20 can effectively reduce/absorb the impact force, preventing the plate part 930 from deforming. Note that, for the purpose of ease of understanding, the deformation of the cushioning component 20 shown in FIG. 6 may be slightly exaggerated. In one actual situation, the deformation of the cushioning component 20 and the movement of the plate part 930 caused by the impact force within the predetermined range may be smaller than that is shown in FIG. 6. In addition, the arrow shown in FIG. 6 is exemplary for the direction of the impact force and not intended to limit the capability of the cushioning component 20.

As the impact force goes away, the restoring force provided by the cushioning component 20 can be responsible to restore the fastener 2 and the plate part 930 back to their original positions. And the image capturing unit is pulled back to its predetermined position.

Accordingly, the cushioning component 20 of the screw nut 1 can not only be used to secure the plate part 930 to the housing part 910 but also can provide an allowance for the plate part 930 to conduct a small range and multi-directional movements, effectively reducing the impact on the plate part 930 so as to prevent the fixation portions of the plate part 930 from deforming. In the application that the electronic device 9 is an image sensing device, the screw nut 1 can prevent force from permanently deforming the plate part 930, thereby preventing the image capturing unit from permanently out of its original position. As a result, the image capturing unit is prevented from occurring sensing error due to the deformation of the plate part.

Herein, note that the configuration of the aforementioned cushioning component is exemplary; in some other embodiments, the cushioning component being elastically connected between the inner nut component and the outer nut component may be in other suitable forms, such as a rubber ring filled in the space between the inner nut component and the outer nut component.

In addition, the aforementioned teeth arrangement for strengthening the connection among the outer nut component 10, the cushioning component 20, and the inner nut component 30 are optional. In some other embodiments, the screw nut may omit these teeth if the outer nut component, the cushioning component, and the inner nut component have sufficient engagements therebetween.

Further, the quantity of the fixation component 3 in the electronic device 9 may be modified as required. In some other embodiments, the plate part may be fixed to the housing part merely via one fixation component.

According to the screw nut and the electronic device having the same as discussed in the above embodiments of the disclosure, since the inner nut component and the outer nut component that are used for the fixation of fastener has a cushioning component therebetween, the inner nut component can be movably connected to the outer nut component in multi-directional directions via the cushioning component, thus in the application that the screw nut is used to fix a plate part to a housing part of an electronic device, the screw nut can allow the plate part to have a small and multi-directional range of motion with respect to the housing part, thereby effectively cushioning the impact force on the plate part so as to prevent the fixation portions of the plate part from deforming due to the impact force.

For example, in the case that the aforementioned electronic device is an image sensing device, the impact force that the image capturing unit applies on the plate part will be suppressed/absorbed by the cushioning component, thereby preventing the impact force from permanently deforming the plate part. As a result, the image capturing unit is prevented from permanently out of its original position due to the deformation of the plate part, thus the inaccurate positioning of the image capturing unit and the calibration due to position deviation are prevented.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A screw nut, configured for fixation of a fastener, the screw nut comprising:
    an inner nut component, having a screw hole portion configured for fixation of the fastener;
    a cushioning component, sleeved on the inner nut component, wherein the cushioning component is a spiral flat wire spring; and
    an outer nut component, sleeved on the cushioning component, wherein the cushioning component is connected between the inner nut component and the outer nut component so that the inner nut component is movably connected to the outer nut component;
    wherein the outer nut component has a plurality of teeth arranged along an edge of the outer nut component and spaced apart from one another, the cushioning component has a plurality of teeth radially protruding outward from an edge of the cushioning component and spaced apart from one another, the plurality of teeth of the outer nut component are meshed with the plurality of teeth of the cushioning component.

2. The screw nut according to claim 1, wherein the cushioning component forms a spiral-shaped gap between the inner nut component and the outer nut component.

3. A screw nut, configured for fixation of a fastener, the screw nut comprising:
    an inner nut component, having a screw hole portion configured for fixation of the fastener;
    a cushioning component, sleeved on the inner nut component, wherein the cushioning component is a spiral flat wire spring; and
    an outer nut component, sleeved on the cushioning component, wherein the cushioning component is connected between the inner nut component and the outer nut component so that the inner nut component is movably connected to the outer nut component;
    wherein the cushioning component has a plurality of teeth radially protruding inward from an edge of the cushioning component and spaced apart from one another, the inner nut component has a plurality of teeth arranged along an edge of the inner nut component and spaced apart from one another, the plurality of teeth of the cushioning component are meshed with the plurality of teeth of the inner nut component.

4. An electronic device, configured to be assembled using at least one fastener, the electronic device comprising:
- a housing part;
- a plate part, having at least one through hole configured for insertion of the at least one fastener; and
- at least one screw nut, configured for fixation of the at least one fastener, the at least one screw nut comprising:
  - an inner nut component, having a screw hole portion configured for fixation of the at least one fastener;
  - a cushioning component, sleeved on the inner nut component, wherein the cushioning component is a spiral flat wire spring; and
  - an outer nut component, sleeved on the cushioning component, wherein the cushioning component is connected between the inner nut component and the outer nut component so that the inner nut component is movably connected to the outer nut component;
- wherein the outer nut component is fixed to the housing part, and the plate part is fixed to the housing part via the at least one fastener being screwed into the screw hole portion of the inner nut component;
- wherein the outer nut component has a plurality of teeth arranged along an edge of the outer nut component and spaced apart from one another, the cushioning component has a plurality of teeth radially protruding outward from an edge of the cushioning component and spaced apart from one another, the plurality of teeth of the outer nut component are meshed with the plurality of teeth of the cushioning component radially protruding outward from the edge of the cushioning component.

5. The electronic device according to claim 4, wherein the cushioning component forms a spiral-shaped gap between the inner nut component and the outer nut component.

6. The electronic device according to claim 4, wherein the plate part is a heat dissipation plate.

7. The electronic device according to claim 4, wherein the cushioning component has a plurality of teeth radially protruding inward from another edge of the cushioning component and spaced apart from one another, the inner nut component has a plurality of teeth arranged along an edge of the inner nut component and spaced apart from one another, the plurality of teeth of the cushioning component radially protruding inward from the another edge of the cushioning component are meshed with the plurality of teeth of the inner nut component.

* * * * *